(12) United States Patent
Feng et al.

(10) Patent No.: US 12,159,794 B2
(45) Date of Patent: Dec. 3, 2024

(54) WAFER PROCESSING METHOD AND CARRIER

(71) Applicant: SCIENTECH CORPORATION, Taipei (TW)

(72) Inventors: Chuan-Chang Feng, Taipei (TW); Mao-Lin Liu, Taipei (TW)

(73) Assignee: SCIENTECH CORPORATION, Taipei (TW)

( * ) Notice: Subject to any disclaimer, the term of this patent is extended or adjusted under 35 U.S.C. 154(b) by 422 days.

(21) Appl. No.: 17/575,624

(22) Filed: Jan. 13, 2022

(65) Prior Publication Data

US 2023/0079627 A1 Mar. 16, 2023

(30) Foreign Application Priority Data

Sep. 11, 2021 (TW) ................................. 110133907

(51) Int. Cl.
*H01L 21/67* (2006.01)
*H01L 21/677* (2006.01)

(52) U.S. Cl.
CPC .. *H01L 21/67057* (2013.01); *H01L 21/67051* (2013.01); *H01L 21/6708* (2013.01); *H01L 21/67086* (2013.01)

(58) Field of Classification Search
CPC ......... H01L 21/67057; H01L 21/67051; H01L 21/6708; H01L 21/67086; H01L 21/67796
See application file for complete search history.

(56) References Cited

U.S. PATENT DOCUMENTS

| | | | | |
|---|---|---|---|---|
| 6,074,515 A | * | 6/2000 | Iseki | H01L 21/67781 414/744.1 |
| 2002/0035762 A1 | * | 3/2002 | Okuda | B08B 3/02 134/102.1 |
| 2003/0010643 A1 | | 1/2003 | Gramarossa et al. | |
| 2005/0208774 A1 | * | 9/2005 | Fukunaga | C23G 3/027 257/E21.174 |

(Continued)

FOREIGN PATENT DOCUMENTS

| | | |
|---|---|---|
| CN | 112786481 A | 5/2021 |
| JP | H07176507 A | 7/1995 |

(Continued)

OTHER PUBLICATIONS

Search Report dated Jun. 20, 2022 of the corresponding European patent application No. 22151641.2.

*Primary Examiner* — Alexander Markoff
(74) *Attorney, Agent, or Firm* — Chun-Ming Shih; HDLS IPR SERVICES

(57) ABSTRACT

This disclosure provides a wafer processing method having the following steps: providing a wafer (10), an immersion device (100), a carrier (200), and a spray device (300); turning the wafer (10) from a horizontal manner to an upright manner; upright placing the wafer (10) into the immersion device (100) for immersion; taking the wafer (10) out from the immersion device (100) and placing that onto the carrier (200) horizontally; spraying a liquid on the wafer (10) by the spray device (300); rinsing the wafer (10); rotating the carrier (200) to dry the wafer (10). Multiple steps for processing the wafer (10) may be performed on the same carrier (200) to accelerate the process.

11 Claims, 10 Drawing Sheets

(56) References Cited

U.S. PATENT DOCUMENTS

| | | | |
|---|---|---|---|
| 2006/0219257 A1* | 10/2006 | Sawaki | H01L 21/67057 |
| | | | 134/32 |
| 2008/0223411 A1* | 9/2008 | Mokuo | B08B 3/048 |
| | | | 134/25.4 |
| 2015/0270147 A1* | 9/2015 | Kobayashi | H01L 21/68721 |
| | | | 134/76 |
| 2015/0357213 A1* | 12/2015 | Yokoyama | H01L 21/67742 |
| | | | 134/32 |
| 2018/0158701 A1* | 6/2018 | Hyakutake | H01L 21/67057 |
| 2020/0126831 A1* | 4/2020 | Feng | B08B 3/02 |
| 2023/0079627 A1* | 3/2023 | Feng | H01L 21/67796 |

FOREIGN PATENT DOCUMENTS

| | | |
|---|---|---|
| JP | 2006004955 A | 1/2006 |
| JP | 2020502778 A | 1/2020 |
| JP | 2020141063 A | 9/2020 |
| KR | 20090074556 A | 7/2009 |
| KR | 10-2015-0110372 A | 10/2015 |
| KR | 10-2018-0052528 A | 5/2018 |
| KR | 2020 0068110 * | 6/2020 |
| TW | M589894 U | 1/2020 |
| TW | 202017097 A | 5/2020 |
| TW | 202020929 A | 6/2020 |
| WO | 2020174962 A1 | 9/2020 |

* cited by examiner

WAFER PROCESSING METHOD AND CARRIER

BACKGROUND

Technical Field

The disclosure relates to a wafer processing, particularly to a wafer processing method and a carrier, which make multiple steps for a wafer be performed on the same carrier that is liftable, lowerable, turnable, and rotatable.

Related Art

A related-art wafer processing method includes multiple steps, such as immersing, spraying, rinsing, and drying, etc. Generally speaking, the station of each step is disposed with a specific device to perform the step. A wafer must be conveyed between stations by robotic hands. As a result, the equipment costs are high, the conveyance is time consuming and the transferring for the stations needs to be repositioned. Thus, the production efficiency of the related-art wafer processing line is not good enough.

In view of this, the inventors have devoted themselves to the above-mentioned related art, researched intensively and cooperated with the application of science to try to solve the above-mentioned problems.

SUMMARY

The disclosure provides a wafer processing method and a carrier, which make multiple steps for a wafer be performed on the same carrier that is liftable, lowerable, turnable, and rotatable.

The disclosure provides a wafer processing method, which includes the steps of: a) providing a wafer, an immersion device, a carrier and a spray device; b) turning the wafer from a horizontal manner to an upright manner; c) upright immersing the wafer in the immersion device; d) taking the wafer out from the immersion device and placing the wafer on the carrier horizontally; e) spraying a liquid on the wafer by the spray device; f) rinsing the wafer; and g) rotating the carrier to dry the wafer.

In the wafer processing method of the disclosure, further includes: turning the carrier to upright place the wafer in the spray device; spraying the chemical liquid to the wafer in the upright manner; and turning the carrier to horizontally place the wafer.

In the wafer processing method of the disclosure, the carrier includes a cover and a holder relatively movable of entering or leaving the cover, the method further includes: horizontally placing the wafer on the holder.

In the wafer processing method of the disclosure, further includes: moving the holder into the cover, and rinsing the wafer in the cover.

In the wafer processing method of the disclosure, further includes: moving the holder out from the cover, and rotating the holder.

In the wafer processing method of the disclosure, further includes: providing an input arm, and placing the wafer in the immersion device by the input arm.

In the wafer processing method of the disclosure, further includes: providing a shift arm, and taking the wafer out from the immersion device and transferring the wafer to the shift arm by the input arm, and turning the wafer and placing the wafer onto the carrier by the shift arm.

The wafer processing method of the disclosure further includes: taking the wafer from the carrier and outputting the wafer. The wafer is taken from the carrier and output by the input arm.

In the wafer processing method of the disclosure, further includes: providing an input arm, and taking the wafer from the carrier and outputting the wafer by the input arm.

In the wafer processing method of the disclosure, further includes: providing multiple wafers, the immersion device, multiple carriers and multiple spray devices corresponding to each carrier, separately turning and placing each wafer onto each carrier to successively perform the following steps on each carrier. The wafer processing method of the disclosure, further includes: providing multiple shift arms, and separately turning and placing each wafer onto each carrier by each shift arm. The wafers are jointly placed in the immersion device.

The disclosure also provides a carrier for processing a wafer. The carrier includes a cover, a holder, an elevator mechanism and a turning mechanism. The holder is disposed in the cover and used to hold the wafer. The elevator mechanism is connected between the holder and the cover to relatively move the holder and the cover to make the holder enter or leave the cover. The turning mechanism is linked with the holder to turn the holder.

The wafer processing method of the disclosure provides a carrier which is liftable, lowerable, turnable, and rotatable. This makes a wafer be able to be performed with spraying, rinsing and drying steps upright and horizontally on the same carrier. As a result, time consuming resulted from conveying between stations and from positioning may be effectively reduced to accelerate the manufacturing process. Further, the disclosure reduces the volume of single production line, thereby the same space being able to accommodate more process line to increase a yield of the manufacturing process.

DETAILED DESCRIPTION

Figure 1:
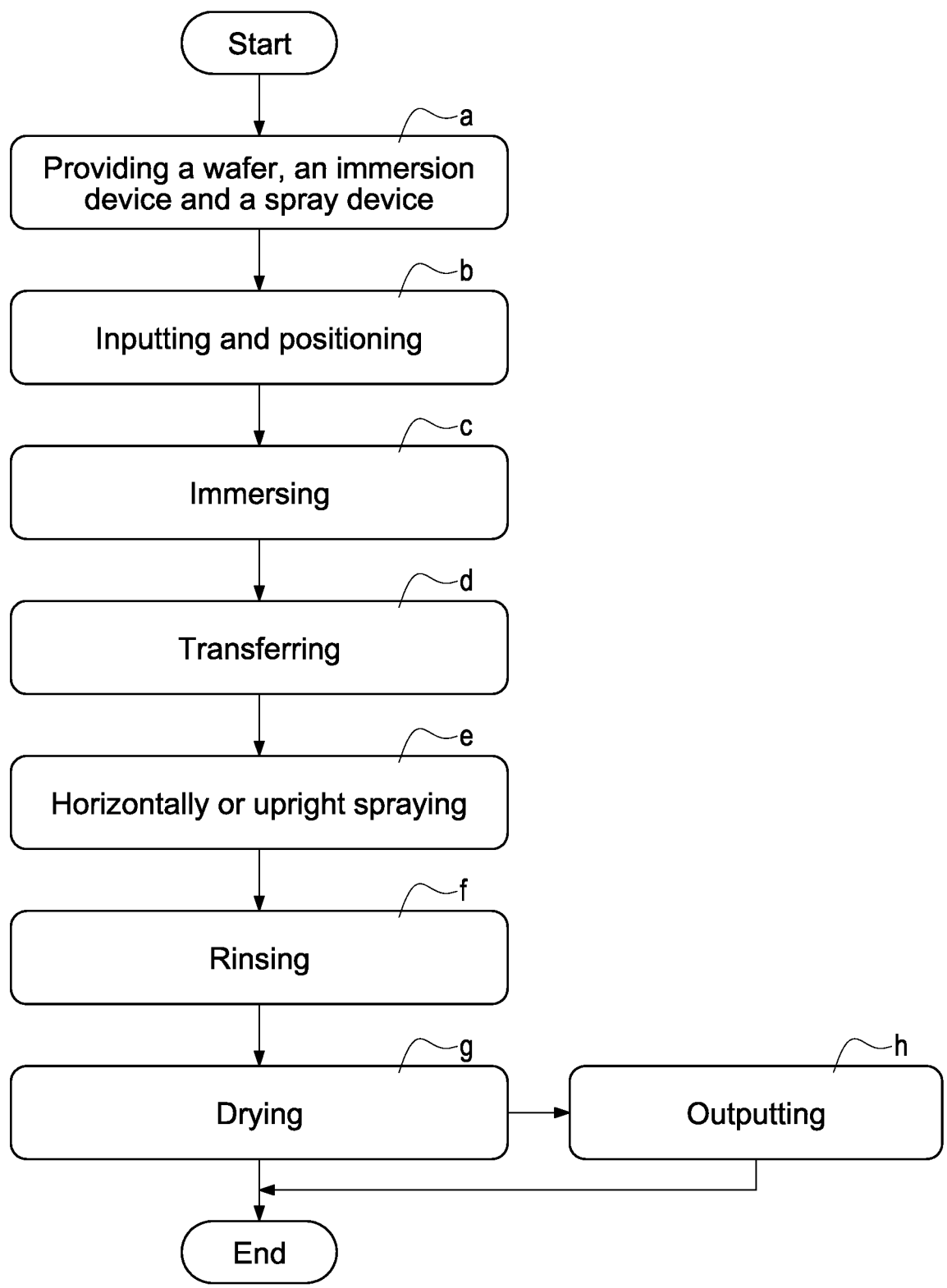
FIG. 1 is a flowchart of the wafer processing method of the disclosure.

The technical contents of this disclosure will become apparent with the detailed description of embodiments accompanied with the illustration of related drawings as follows. It is intended that the embodiments and drawings disclosed herein are to be considered illustrative rather than restrictive.

Please refer to FIGS. 1-4. The disclosure provides a wafer processing method, which includes the following steps.

First, in step a, at least one wafer 10, an immersion device 100, a carrier 200, a spray device 300, an input arm 410 and a shift arm 420 are provided. The immersion device 100 includes a reservoir 110 and a clamp 120. The reservoir 110 is configured to hold the chemical liquid (etching solution) for an immersion process. The clamp 120 is arranged to be movable relative to the reservoir 110 to enter or leave the reservoir 110. The input arm 410 and the shift arm 420 are robotic arms for conveying the wafer 10 between processing stations.

The carrier 200 is used to hold and move a wafer 10 to be processed to implement the wafer processing process. The carrier 200 includes a cover 210, a holder 220, an elevator mechanism 230, a turning mechanism 240 and a rotation mechanism 260. In the embodiment, the cover 210 is a round hood (cover) with an opening on the top. The holder 220 is disposed in the cover 210 and used to hold the wafer 10. The elevator mechanism 230 is connected with at least one of the holder 220 and the cover 210 to drive the holder 220 to enter or leave the cover 210. In the embodiment, the elevator mechanism 230 is connected to the holder 220 to move the holder 220 relative to the cover 210 so as to make the holder 220 enter or leave the cover 210. In detail, the elevator mechanism 230 may have at least one telescopic rod which may be electric cylinder (linear actuator) or a pneumatic cylinder. The telescopic rod may be connected with either one of the holder 220 and the cover 210, and the other one may be fixed relative to the elevator mechanism 230 to make the holder 220 and cover 210 be able to move relatively. The elevator mechanism 230 may include multiple telescopic rods separately connected with the holder 220 and the cover 210 to separately move the holder 220 and the cover 210. The turning mechanism 240 is linked with the holder 220 to be able to turn the holder 220. The disclosure does not limit the type of the turning mechanism 240. In particular, the turning mechanism 240 may include a base for the holder 220 to be pivotably disposed thereon. Also, the turning mechanism 240 may further include a motor connected to the spindle (shaft) thereof to drive the spindle to rotate to turn the holder 220, or include a telescopic rod with one end being fixed and the other end directly or indirectly connected to the holder 220 to push the holder 220 to turn along the spindle. In the embodiment, the turning mechanism 240 is indirectly connected to the holder 220 through the elevator mechanism 230 to make the holder 220 and the cover 210 turn with the elevator mechanism 230 synchronously. The rotation mechanism 260 is linked with the holder 220 to rotate the holder 220. The rotation mechanism 260 may only be linked with the holder 220 to rotate or may be linked with both the holder 220 and the cover 210 to simultaneously rotate.

Figure 3:
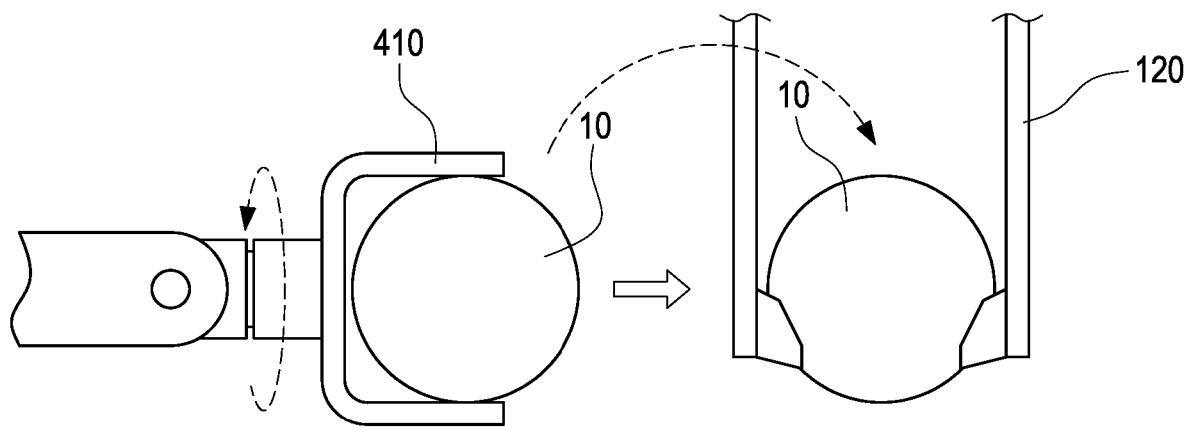
FIG. 3 is a schematic view of the input and positioning step of the wafer processing method of the disclosure.

Please refer to FIG. 3. Next to step a, in the step b of inputting and positioning, the input arm 410 is configured to hold (grip) the wafer 10, which is horizontally placed, to input the manufacturing production line of the embodiment. Because the wafer 10 is input from the outside of the production line and not positioned with each apparatus in the production line, the input arm 410 is configured to hold the wafer 10 and place the wafer to a positioning device to scan the wafer 10 for positioning the center position of the wafer 10. Then, the input arm 410 is configured to hold a specific part of the wafer 10 according to the center position of the wafer 10, and the input arm 410 is configured to turn the horizontally placed wafer 10 to a upright manner and then place the wafer 10 in the clamp 120 of the immersion device 100.

Figure 4:
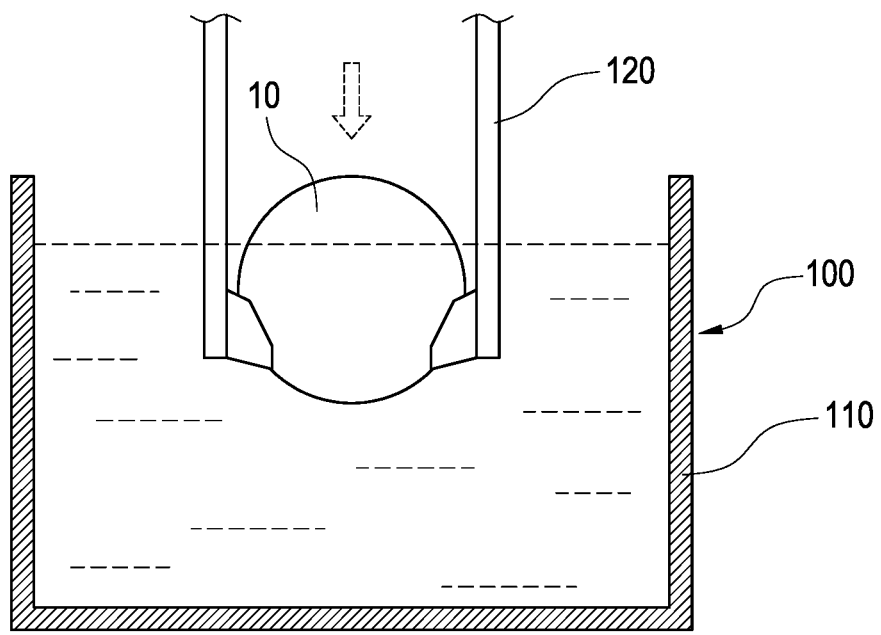
FIG. 4 is a schematic view of the immersing step of the wafer processing method of the disclosure.

Please refer to FIG. 4. Next to step b, in step c, the clamp 120 is configured to upright hold the wafer 10 and upright place the wafer 10 into the reservoir 110 for immersion.

Figure 5:
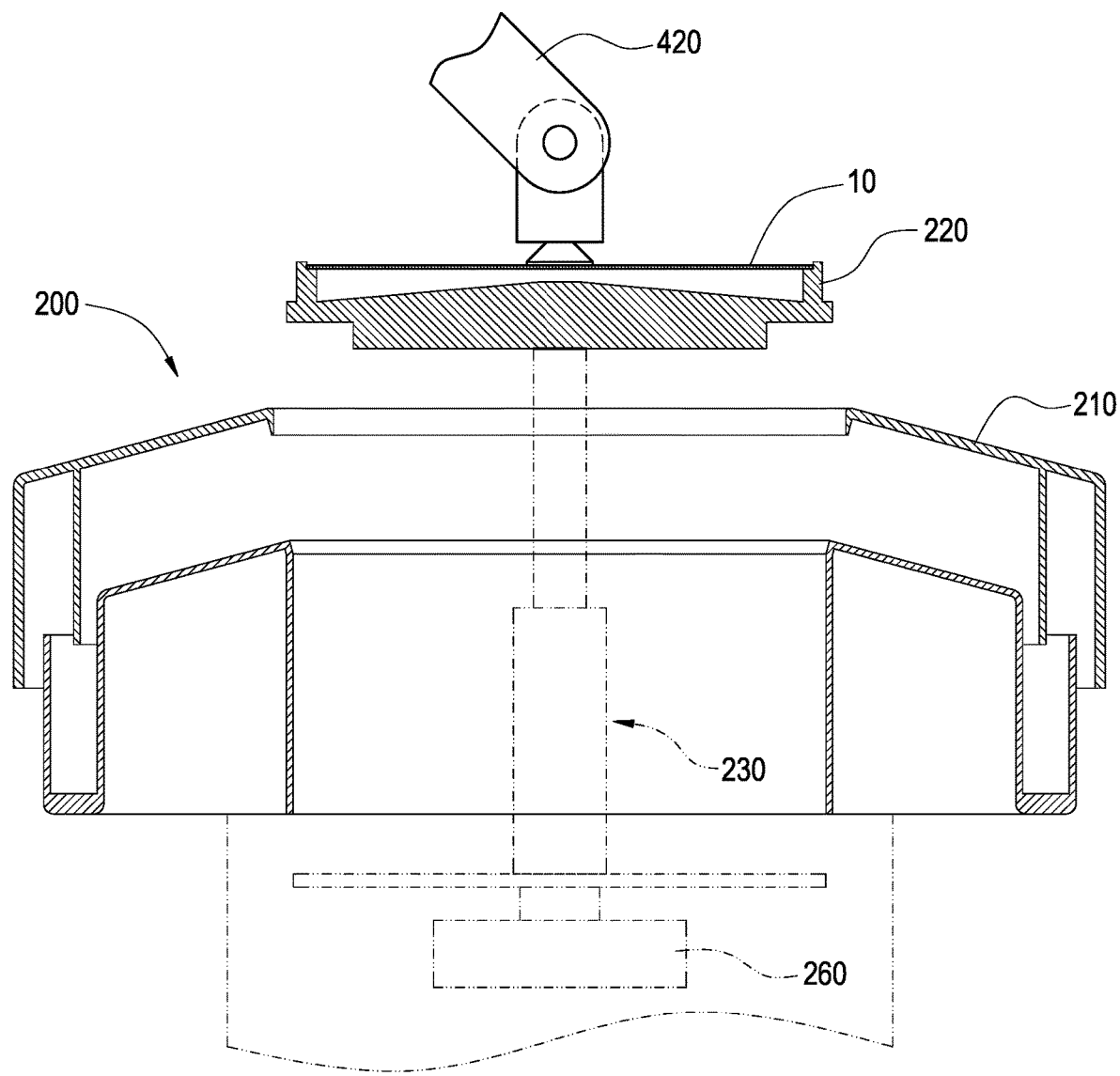
FIG. 5 is a schematic view of the shifting step of the wafer processing method of the disclosure.

Please refer to FIG. 5. Next to step c, in the step d of shifting (transferring) step, the wafer 10 is taken out from the immersion device 100 by the clamp 120 and transferred to the shift arm 420, and the shift arm 420 is configured to turn the wafer 10 and place the wafer 10 onto the holder 220 of the carrier 200 horizontally.

Please refer to FIGS. 1, 2 and 6 to 7. Next to step d, in the step e of spraying step, the spray device 300 is configured to spray a chemical liquid (etching solution) onto the wafer 10. The spray device 300 at least includes a process nozzle 310 connected to a chemical liquid source to provide the chemical liquid for the process. In the embodiment, the spray device 300 further includes a case 320, and the process nozzle 310 in placed in the case 320.

Figure 2:
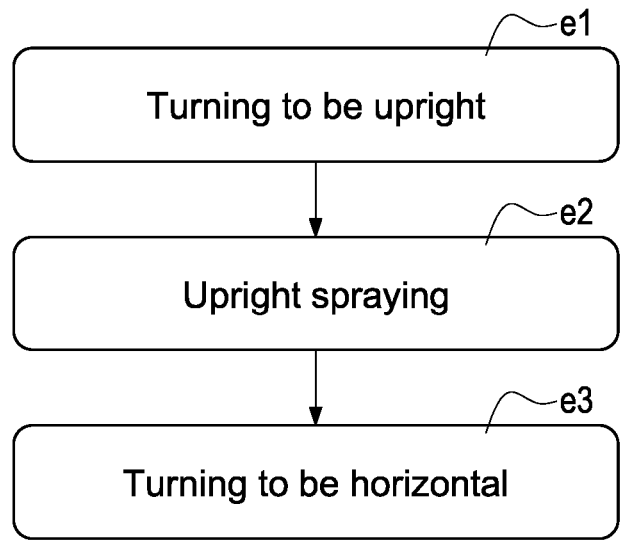
FIG. 2 is s flowchart of the spraying step of the wafer processing method of the disclosure.
Figure 6:
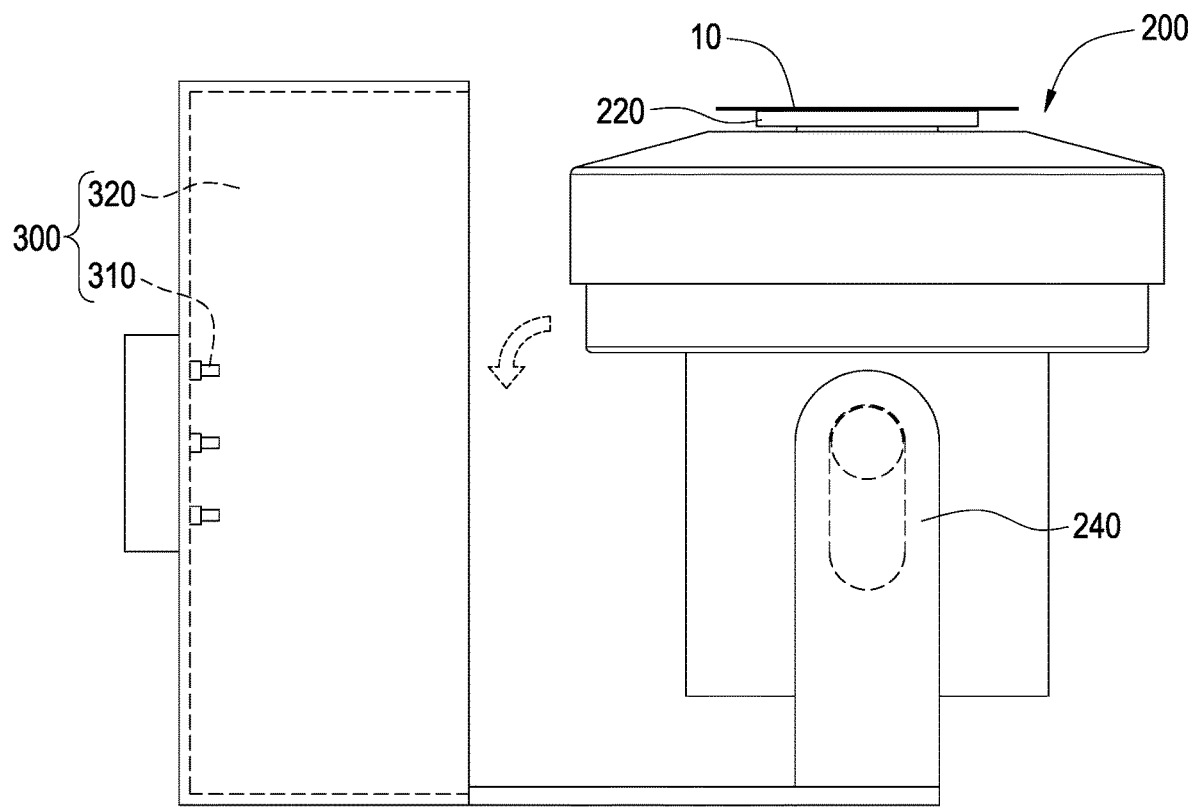
FIGS. 6-9 are schematic views of the spraying step of the wafer processing method of the disclosure.
Figure 7:
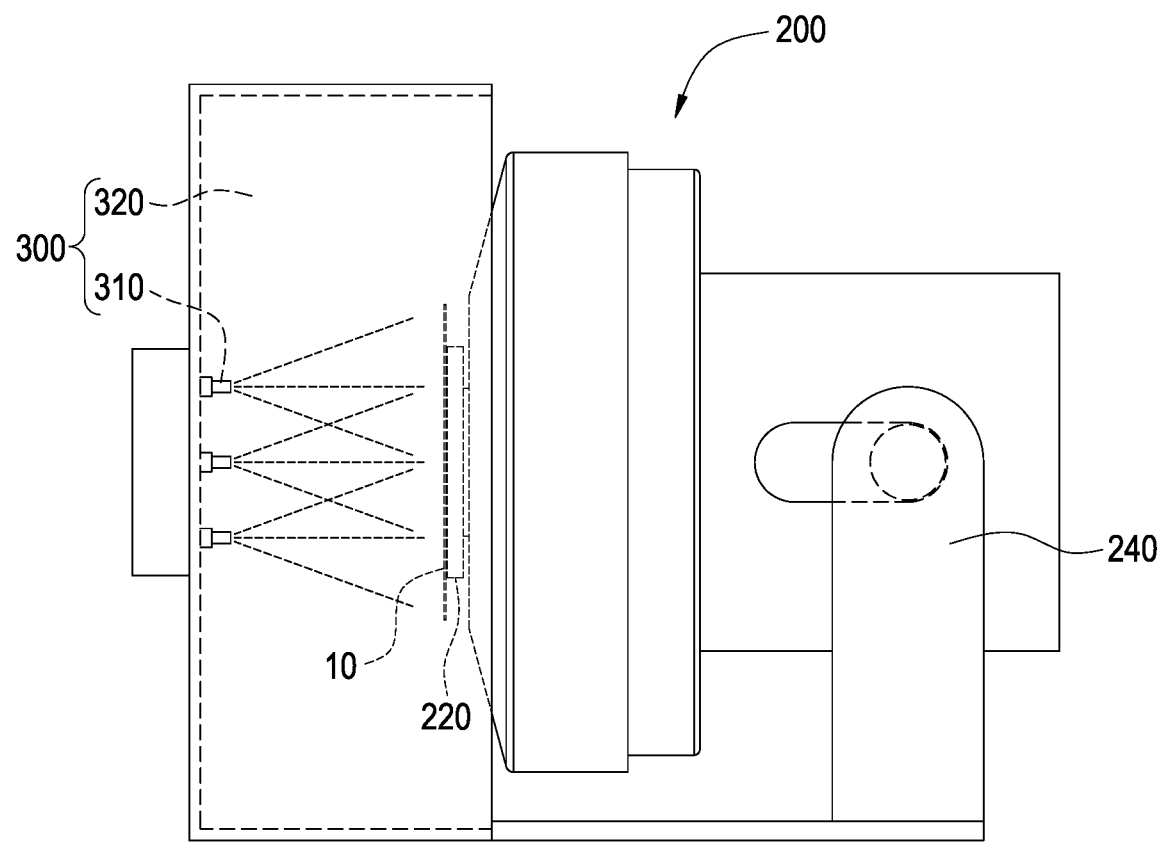
Figure 8:
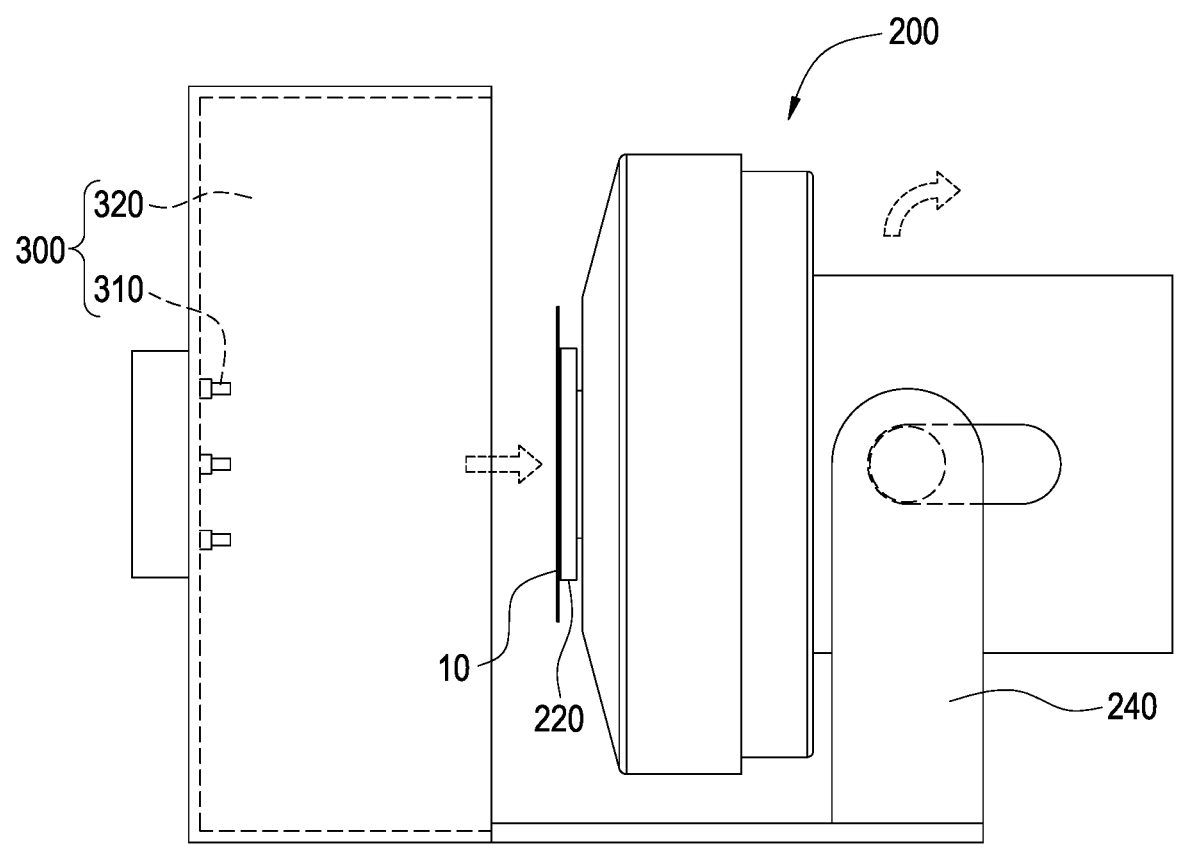

In the embodiment, when the spray device 300 is upright spraying the wafer 10 on the carrier 20, the step e may include the following steps:

e1) Please refer to FIGS. 2 and 6. The turning mechanism 240 is configured to turn the holder 220 of the carrier 200 to upright place the wafer 10 into the case 320 of the spray device 300 to make the process nozzle 310 be located on a side of the holder 220 and face a surface of the wafer 10. In the embodiment, when the holder 220 is turned, the turning mechanism 240 also links the cover 210 to turn, but not limited to this.

e2) Please refer to FIGS. 2 and 7. The spray device 300 is used to spray the chemical liquid (etching solution) onto the wafer 10 upright placed on the holder 220. During the spraying process, the overflowing chemical liquid is collected in the case 320 and then ejected.

e3) Please refer to FIGS. 2 and 8. The turning mechanism 240 is used to turn the holder 220 of the carrier 200 to make the wafer 10 be horizontally placed.

Figure 9:
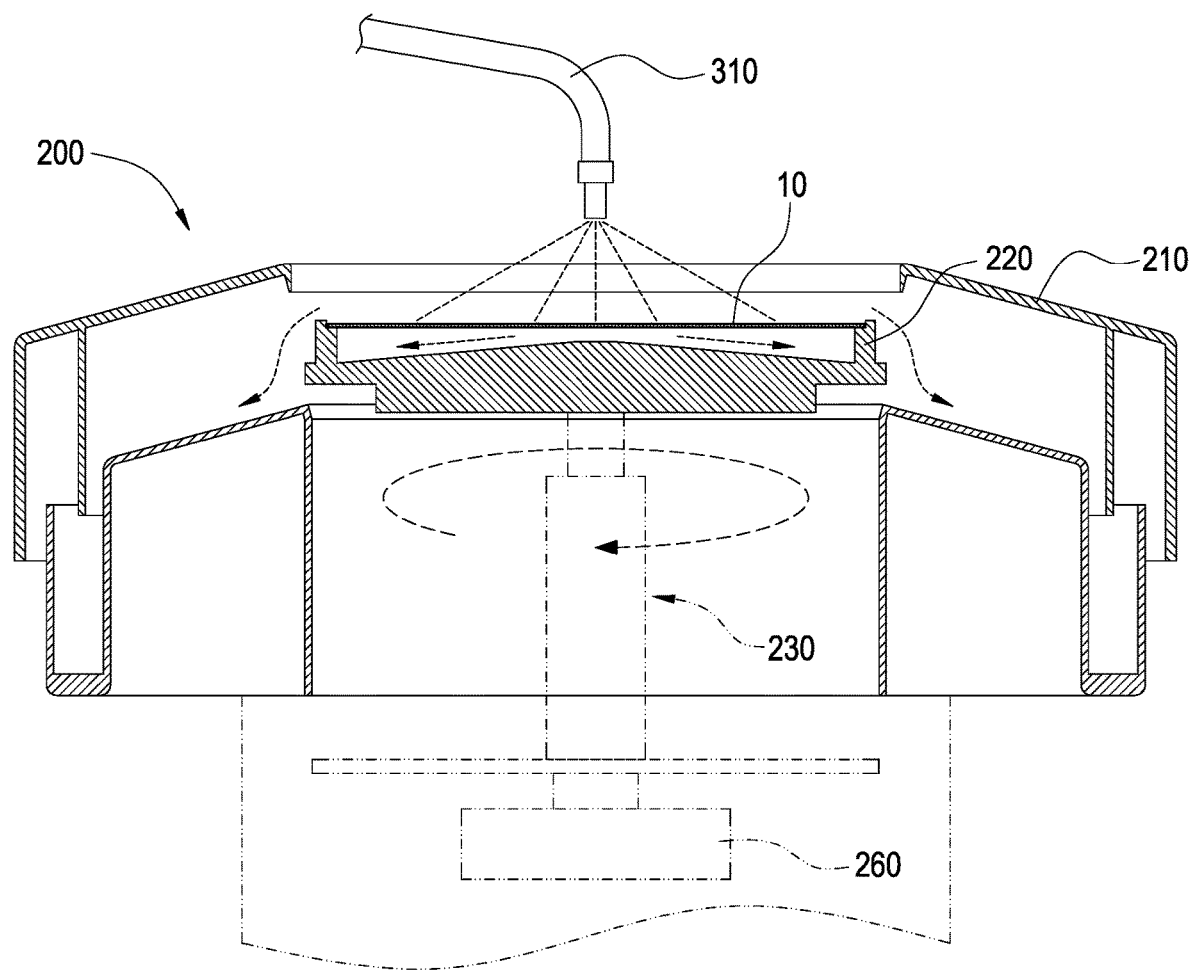

Please refer to FIGS. 1 and 9. In the step e of spraying step, the spray device 300 may also spray the wafer 10 on the carrier 200 horizontally. When horizontally spraying, the process nozzle 310 is moved over the holder 220 and the process nozzle 310 downward sprays the chemical liquid to the surface of the horizontally-placed wafer 10. And the overflowing chemical liquid is collected in the cover 210 and then ejected during the spraying process.

Figure 10:
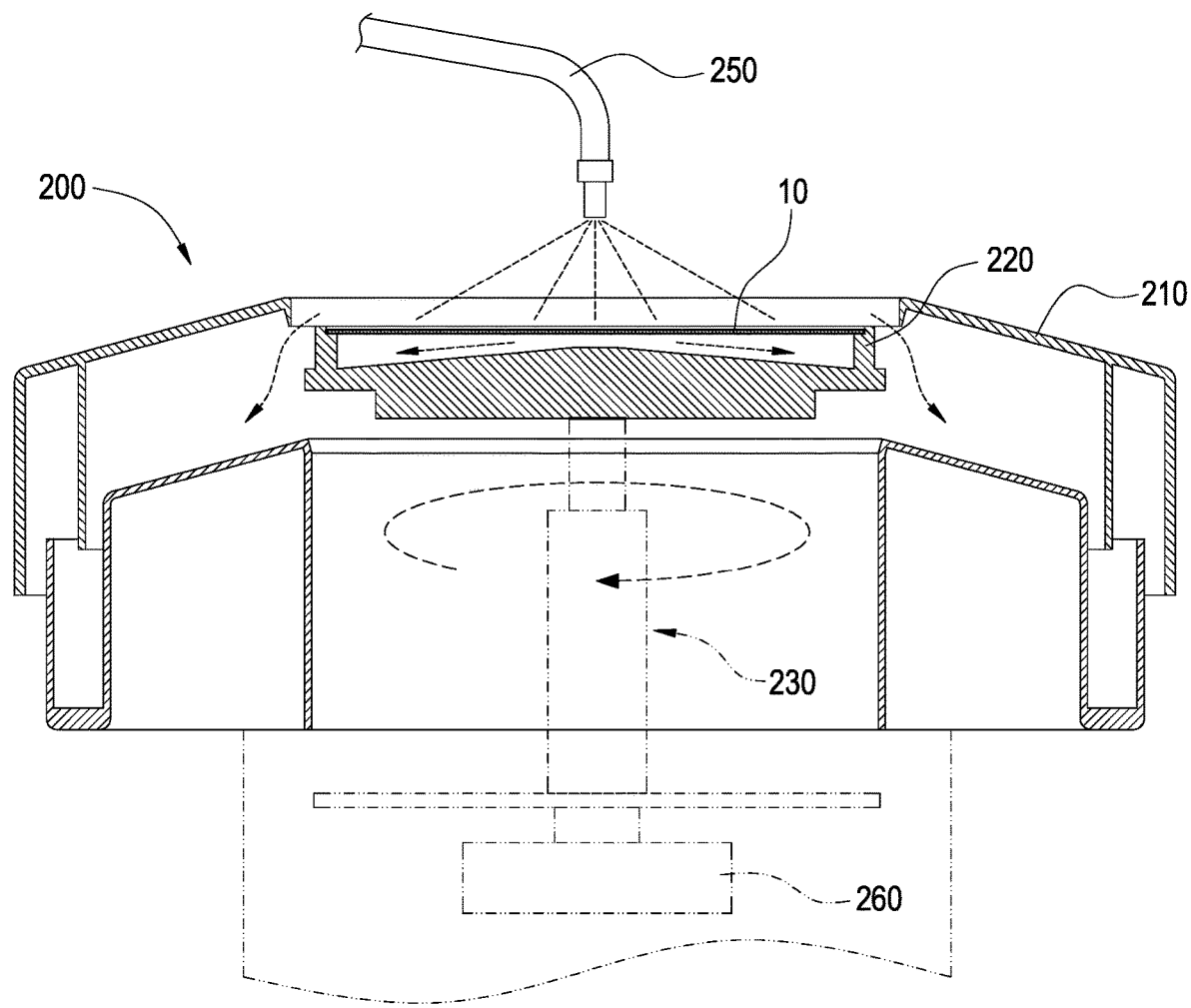
FIG. 10 is a schematic view of the rinsing step of the wafer processing method of the disclosure.

Please refer to FIG. 10. Next to step e, in the step f of rinsing step, the elevator mechanism 230 is configured to move the holder 220 into the cover 210 to close the bottom of the cover 210, and a wash nozzle 250 is used to inject a wash liquid to the cover 210 to rinse the wafer 10 in the cover 210. And the overflowing wash liquid is collected in the cover 210 and then ejected during the rinsing process.

Figure 11:
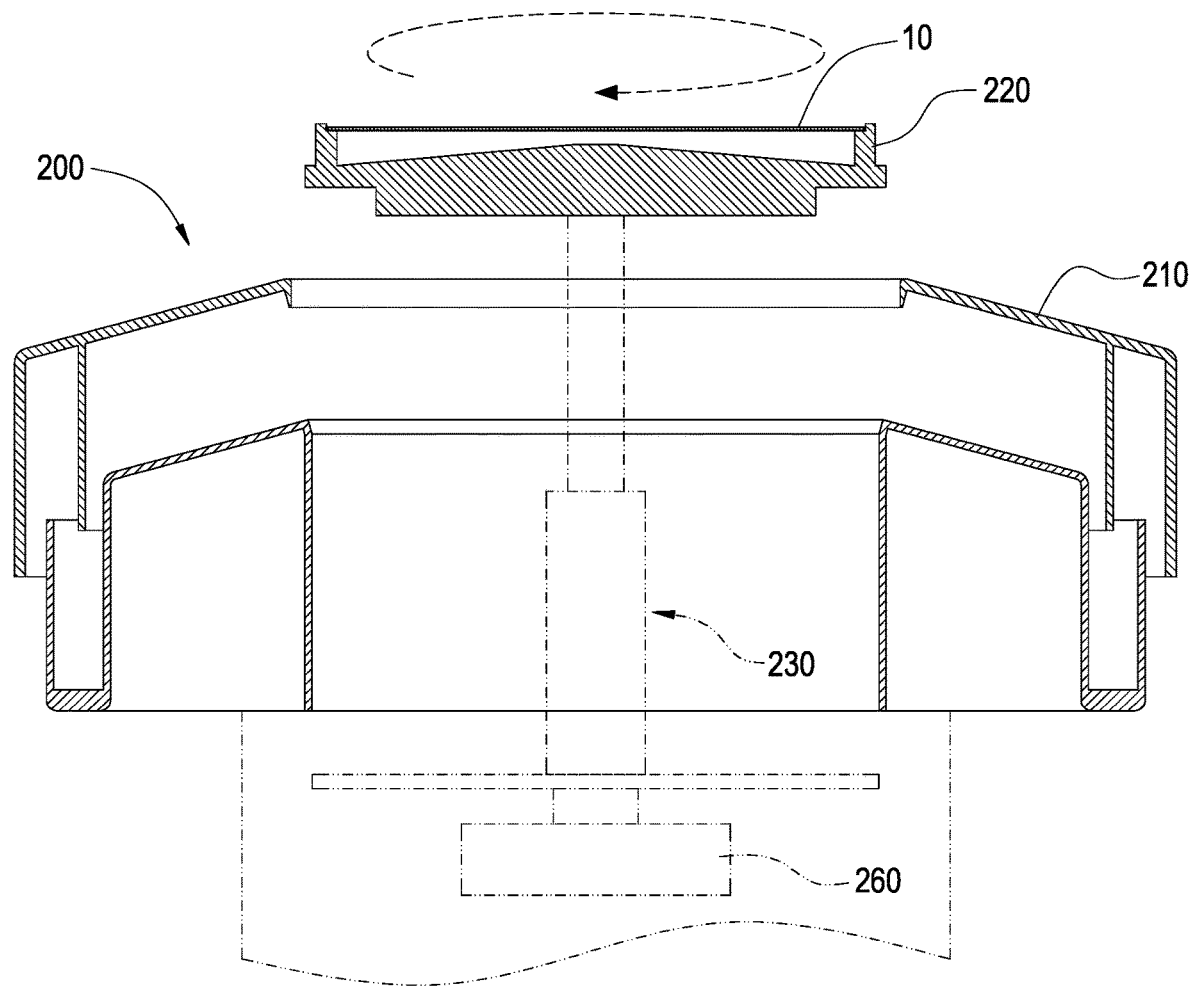
FIG. 11 is a schematic view of the drying step of the wafer processing method of the disclosure.

Please refer to FIG. 11. Next to step f, in the step g of drying step, the carrier 200 is rotated to dry the wafer 10. In detail, the elevator mechanism 230 is configured to move the holder 220 out from the cover 210, and the rotation mechanism 260 is configured to rotate the holder 220 to dry the wafer 10. In the embodiment, when the rotation mechanism 260 rotates the holder 220, the cover 210 is not rotated, but not limited to this.

Next to step g, in the step h of outputting step, the input arm 410 is configured to take the wafer 10 from the carrier 200 and output the wafer 10.

In sum, the wafer processing method of the disclosure provides a carrier that is liftable, lowerable, turnable, and rotatable. This makes a wafer 10 be able to be performed with spraying, rinsing and drying steps upright and horizontally on the same carrier 200. As a result, time consuming resulted from conveying between stations and from positioning may be effectively reduced to accelerate the manufacturing process to increase a yield of the manufacturing process.

Meanwhile, the wafer processing method of the disclosure reduces the volume of equipment of a single production line, so the same space may accommodate more production lines. When multiple production lines work simultaneously, in step a, multiple wafers 10, the immersion device 100 and the input arm 410 may be provided, and multiple spray devices 300 and multiple shift arms 420 may be arranged separately corresponding to multiple carriers 200. In step a, the wafers 10 are jointly placed in a cartridge and jointly placed into the immersion device 100, that is jointly used by multiple production lines, in step b. In step c, the shift arms 420 are used to separately turn and place each wafer 10 onto each carrier 200 and the spraying, rinsing and drying steps are successively performed on each carrier 200.

While this disclosure has been described by means of specific embodiments, numerous modifications and variations could be made thereto by those skilled in the art without departing from the scope and spirit of this disclosure set forth in the claims.

What is claimed is:

1. A wafer processing method, comprising:
   a) providing a wafer (10), an immersion device (100), a carrier (200), a spray device (300) and an input arm (410);
   b) turning the wafer (10) from horizontal status to an upright status;
   c) immersing the wafer (10) in the upright status into the immersion device (100), and placing the wafer (10) into the immersion device (100) by the input arm (410);
   d) taking the wafer (10) out from the immersion device (100) and placing the wafer (10) on the carrier (200) horizontally;
   e) spraying a chemical liquid on the wafer (10) on the carrier (200) by the spray device (300) and comprising:
   e1) turning the wafer (10) into the upright status by turning the carrier (200) and placing the wafer (10) into the spray device (300);
   e2) spraying the chemical liquid to the wafer (10) in the upright manner; and
   e3) turning the wafer (10) into the horizontal status by turning the carrier (200);
   f) rinsing the wafer (10); and
   g) rotating the carrier (200) to dry the wafer (10).

2. The method of claim 1, wherein the carrier (200) comprises a cover (210) and a holder (220) relatively movable of entering or leaving the cover (210), and the step d) further comprises: horizontally placing the wafer (10) on the holder (220).

3. The method of claim 2, wherein the step f) further comprises: moving the holder (220) into the cover (210), and rinsing the wafer (10) in the cover (210).

4. The method of claim 2, wherein the step g) further comprises: moving the holder (220) out from the cover (210), and rotating the holder (220).

5. The method of claim 1, wherein the step a) further comprises: providing a shift arm (420); and the step d) further comprises: taking the wafer (10) out from the immersion device (100) by the input arm (410) and transferring the wafer (10) to the shift arm (420), and turning the wafer (10) to horizontally place the wafer (10) on the carrier (200) by the shift arm (420).

6. The method of claim 1, further comprising:
   h) taking the wafer (10) from the carrier (200) and outputting the wafer (10).

7. The method of claim 6, wherein the step h) further comprises: taking the wafer (10) from the carrier (200) and outputting the wafer (10) by the input arm (410).

8. The method of claim 1, wherein the step a) further comprises: providing an input arm (410); and the step h) further comprises: taking the wafer (10) from the carrier (200) and outputting the wafer (10) by the input arm (410).

9. The method of claim 1, wherein the step a) further comprises: providing multiple wafers (10), the immersion device (100), multiple carriers (200) and multiple spray devices (300) corresponding to each carrier (200); and the step d) further comprises: separately turning and placing each wafer (10) onto each carrier (200) to successively perform the step e), the step f) and the step g) to each wafer (10) on each carrier (200).

10. The method of claim 9, wherein the step a) further comprises: providing multiple shift arms (420); and the step d) further comprises: separately turning and placing each wafer (10) onto each carrier (200) by each shift arm (420).

11. The method of claim 9, wherein the step c) further comprises: jointly placing the wafers (10) in the immersion device (100).

* * * * *